(12) United States Patent
Fedora

(10) Patent No.: US 7,237,437 B1
(45) Date of Patent: Jul. 3, 2007

(54) MEMS SENSOR SYSTEMS AND METHODS

(75) Inventor: Neal R. Fedora, Clearwater, FL (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 11/260,817

(22) Filed: Oct. 27, 2005

(51) Int. Cl.
*G01P 3/04* (2006.01)
*G01P 1/02* (2006.01)

(52) U.S. Cl. .......................... 73/510; 73/493
(58) Field of Classification Search ............... 73/510, 73/511, 493, 431
See application file for complete search history.

(56) References Cited

U.S. PATENT DOCUMENTS

| | | | | |
|---|---|---|---|---|
| 4,601,206 A | * | 7/1986 | Watson | 73/510 |
| 4,869,092 A | * | 9/1989 | Bernard et al. | 73/1.38 |
| 6,128,955 A | * | 10/2000 | Mimura | 73/510 |
| 6,195,261 B1 | * | 2/2001 | Babutzka et al. | 361/752 |
| 6,876,926 B2 | * | 4/2005 | Kirkland et al. | 701/220 |
| 7,040,922 B2 | * | 5/2006 | Harney et al. | 439/527 |

* cited by examiner

*Primary Examiner*—Helen Kwok
(74) *Attorney, Agent, or Firm*—Fogg & Powers LLC

(57) ABSTRACT

MEMS Sensor Systems and Methods are provided. In one embodiment, a method for producing a six degree of freedom inertial sensor is provided. The method comprises fabricating a first silicon wafer segment having at least one inertial sensor pair, the at least one inertial sensor pair comprising one or both of a pair of orthogonally oriented accelerometers and a pair of orthogonally oriented gyroscopes; fabricating a second silicon wafer segment having at least one inertial sensor, the at least one inertial sensor comprising one or both of an accelerometer and a gyroscope; assembling together the first silicon wafer segment and the second silicon wafer segment such that the at least one inertial sensor pair and the at least one inertial sensor are oriented orthogonal to each other; and bonding the first silicon wafer segment to the second silicon wafer segment.

10 Claims, 7 Drawing Sheets

MEMS SENSOR SYSTEMS AND METHODS

BACKGROUND

Fabrication of micro electromechanical systems (MEMS) is being refined every day, creating a multitude of single-axis sensors. Multi-axis sensors are currently production limited to 2-axis with the optimal 3-axis design efficiently unattainable for measuring 6 degrees of freedom (6-DOF). Although inertial measurement units (IMUs) are available that provide 6-DOF capability, they are composed of multiple individual sensors assembled in a 3-axis triad. Inherently, misalignment errors result from even minor imperfections during this assembly process. Additionally, as IMUs today are constructed from multiple individual accelerometers and gyros, their implementation methods are more expensive and error prone.

For the reasons stated above and for other reasons stated below which will become apparent to those skilled in the art upon reading and understanding the specification, there is a need in the art for techniques of reducing misalignment errors in micro electro-mechanical systems.

SUMMARY

The Embodiments of the present invention provide methods and systems for 3-axis MEMS sensor systems and methods and will be understood by reading and studying the following specification.

In one embodiment, a six degree of freedom inertial sensor is provided. The sensor comprises a first silicon wafer segment having at least one inertial sensor pair; a second silicon wafer segment having at least one inertial sensor; wherein the at least one inertial sensor pair comprises one or both of an accelerometer pair and a gyroscope pair; wherein the at least one inertial sensor comprises one or both of an accelerometer and a gyroscope; and wherein the first silicon wafer segment and the second silicon wafer segment are bonded together such the at least one inertial sensor pair and the at least one inertial sensor are orientated orthogonal to each other.

In another embodiment, a method for producing a six degree of freedom inertial sensor is provided. The method comprises fabricating a first silicon wafer segment having at least one inertial sensor pair, wherein the at least one inertial sensor pair comprises one or both of a pair of orthogonally oriented accelerometers and a pair of orthogonally oriented gyroscopes; fabricating a second silicon wafer segment having at least one inertial sensor, wherein the at least one inertial sensor comprises one or both of an accelerometer and a gyroscope; assembling together the first silicon wafer segment and the second silicon wafer segment, wherein the first silicon wafer segment and the second silicon wafer are assembled together such that the at least one inertial sensor pair and the at least one inertial sensor are oriented orthogonal to each other; and bonding the first silicon wafer segment to the second silicon wafer segment.

In yet another embodiment, a six degree of freedom inertial sensor is provided. The sensor comprises means for detecting one or both of acceleration and motion in a direction of a first axis; means for detecting one or both of acceleration and motion in a direction of a second access orthogonal with the first axis; means for detecting one or both of acceleration and motion in a direction of a third axis orthogonal with the first axis and the second axis; wherein the means for detecting one or both of acceleration and motion in a direction of a first axis and the means for detecting one or both of acceleration and motion in a direction of a second access are located on a first silicon wafer means and the means for detecting one or both of acceleration and motion in a direction of a third axis is located on a second silicon wafer means; and means for bonding the first silicon wafer means to the second silicon wafer means.

DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention provide system and methods to reduce misalignment errors, as well as the cost of producing MEMS inertial sensors for use in applications such as, but not limited to, commercial, military and space applications. Embodiments of the present invention exploit the benefits of producing multiple sensors on silicon wafers, using extremely accurate, and currently available integrated circuit and MEMS fabrication methods. By producing multiple sensors on a chip, the cost of development is vastly reduced, permitting the use of this technology in broad markets. Because fabrication methods presented by embodiments of the present invention are very precise, a reduction in sensor error cross-coupling and misalignment is achieved. The resulting improvements in overall IMU sensor performance results in both cheaper and more accurate 6-DOF sensors.

Embodiments of the present invention utilize current accelerometer and gyroscope designs in a homogeneous micro-fabrication process to fabricate both accelerometers and gyroscopes on the same silicon wafers. After fabricating both accelerometers and gyroscopes on two single wafers, embodiments of the present invention provide methods to cut and bond the two wafers to generate a third sensor axis for an all attitude inertial navigation solution. The result is a single 6-DOF MEMS sensor that is both cheaper and more accurate than 6-DOF sensors available in the art today.

Figure 1A:
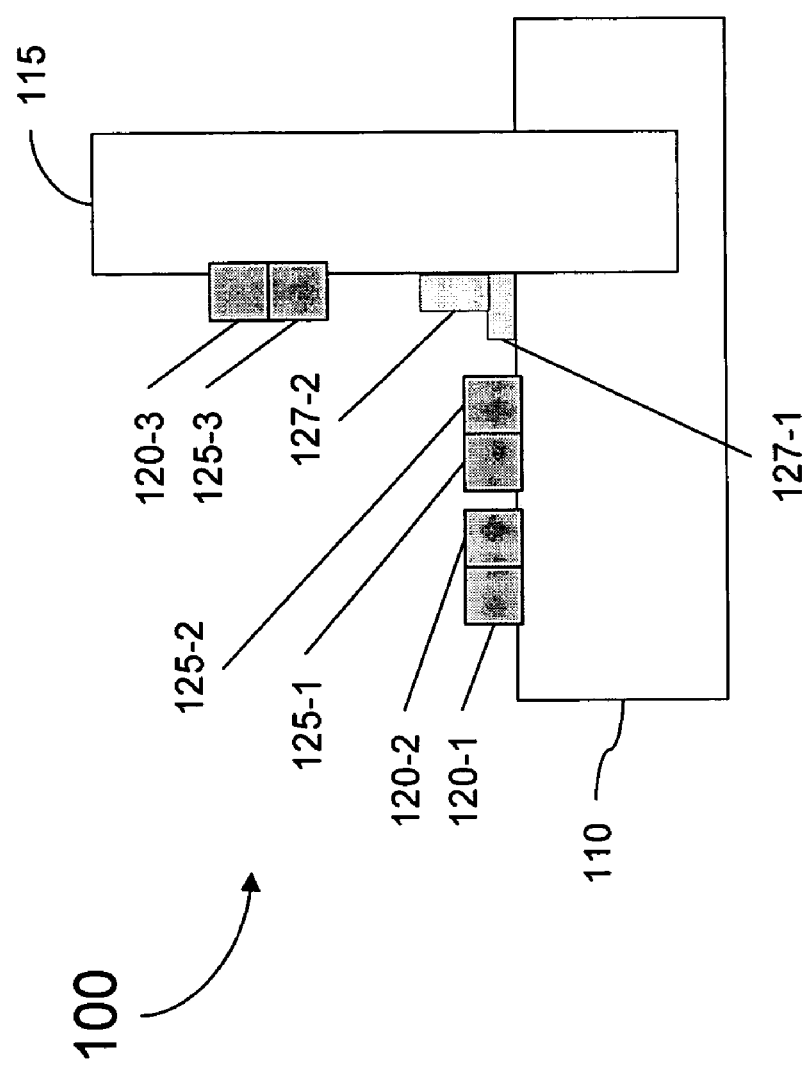
FIGS. 1A and 1B are illustrations of one embodiment of an inertial sensor.
Figure 1B:
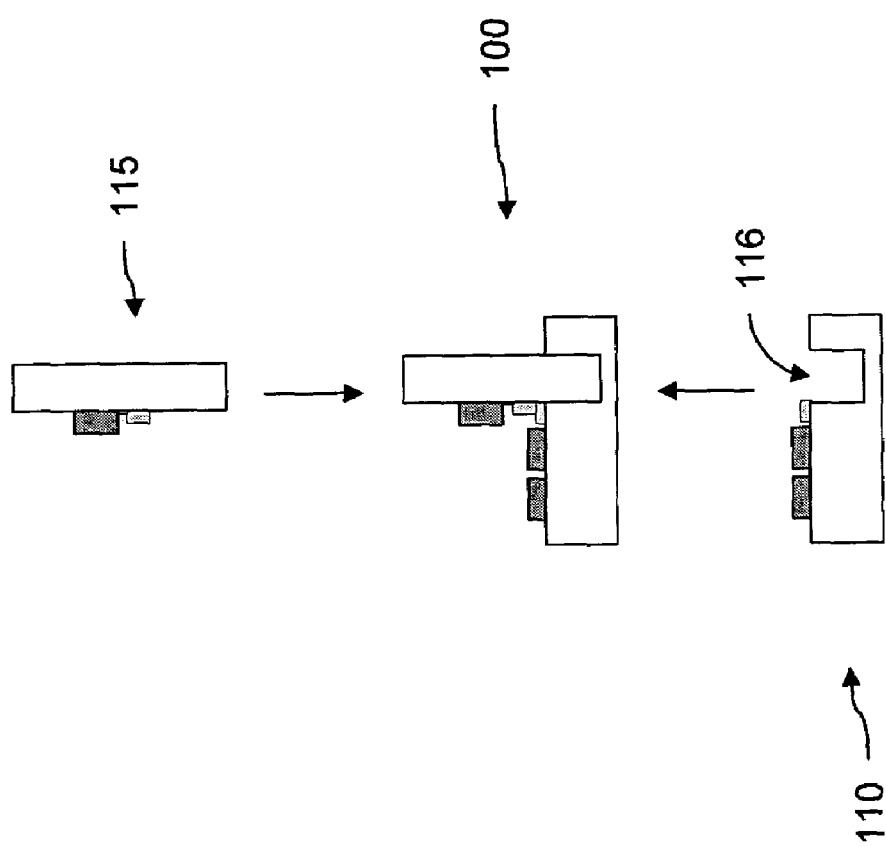

FIGS. 1A and 1B illustrate a 6-DOF MEMS sensor 100 of one embodiment of the present invention. Sensor 100 comprises a first wafer segment 110 having two accelerometers 120-1 and 120-2 oriented to measure accelerations on axes perpendicular with respect to each other, and two gyroscopes 125-1 and 125-2 oriented to measure motion on axes perpendicular with respect to each other. Sensor 100 further comprises a second wafer segment 115 assembled into a perpendicular orientation with first wafer segment 110. In one embodiment, first wafer segment 110 includes a mounting trench 116 into which second wafer segment 115 is vertically inserted, as illustrated in FIG. 1B. In one embodiment, first wafer segment 110 and second wafer segment 115 are bonded together using a silicon fusion bonding or similar process. Second wafer segment 115 includes an accelerometer 120-3 oriented to measure accelerations on an axis perpendicular with respect to accelerometers 120-1 and 120-2, and a gyroscope 125-3 oriented to measure motion on an axis that is orthogonal with respect to gyroscopes 125-1 and 125-2. In one embodiment, first and second wafer segments 110 and 115, respectively are electrically coupled together via contact bridges 127-1 and 127-2. The resultant 6-DOF MEMS sensor 100 is a set of inertial sensors comprising of mutually orthogonal accelerometers, 120-1, 120-2, 120-3 and mutually orthogonal gyroscopes 125-1, 125-2 and 125-3. 6-DOF MEMS sensor 100 is thus installable as a single sensor device package rather than as a triad of single axis sensors individually packaged and mounted. One advantage of sensor 100 is that the axes of accelerometers, 120-1 to 120-3 and gyroscopes 125-1 to 125-3 are inherently aligned with respect to each other to a high degree of precision afforded by integrated circuit manufacturing processes. In contrast, triads of single axis sensors typically comprise single axis sensors mechanically mounted orthogonally on a separate bracket or housing, with the limited alignment precision inherent in such mechanical mountings. In addition, sensor 100 is effectively immune to internal alignment shifts due to thermal effects and ageing, unlike mechanically mounted single axis sensor triads.

Figure 2:
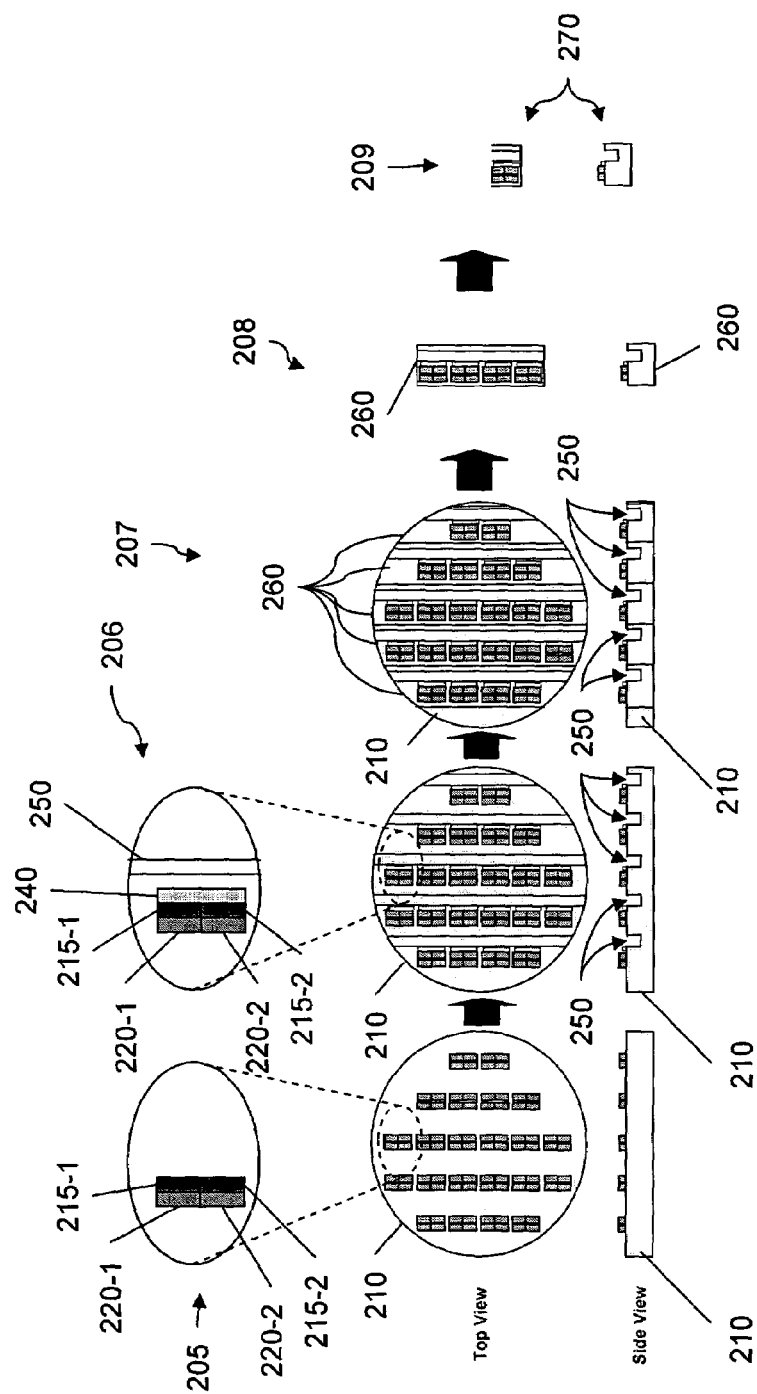
FIG. 2 is an illustration of one embodiment of production of a first silicon wafer segment.
Figure 3:
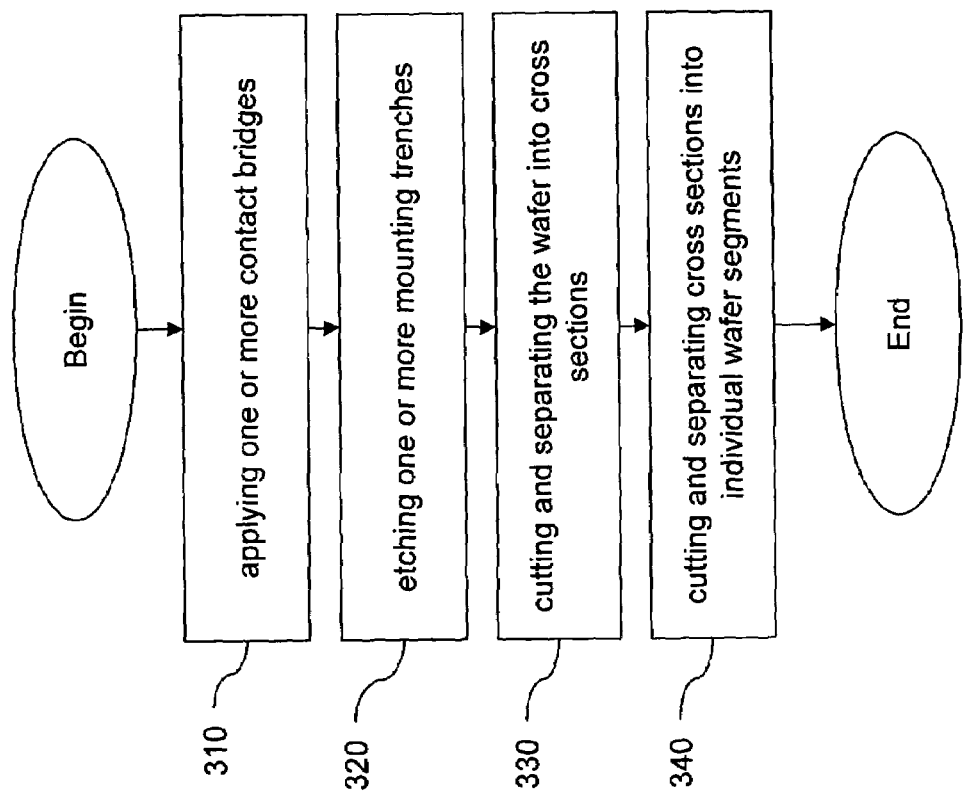
FIG. 3 is a flow chart of one embodiment of a method for producing a first silicon wafer segment.

One skilled in the art would recognize that wafer segments, such as wafer segments 110 and 115 are typically produced in bulk from larger silicon wafers. FIGS. 2 and 3 illustrate one method for producing a wafer segment 110 of one embodiment of the present invention from such a larger silicon wafer 210. Shown generally at 205 in FIG. 2, in one embodiment, silicon wafer 210 comprises a plurality of accelerometer pairs 215-1 and 215-2 and gyroscope pairs 220-1 and 220-2 oriented as described with respect to wafer segment 110 of FIG. 1. As would be appreciated by one skilled in the art upon reading this specification, there are any number of ways of fabricating silicon wafer 210, as discussed in more detail below. FIG. 3 is a flow chart illustrating a method for fabricating a first silicon wafer segment 110 from silicon wafer 210, of one embodiment of the present invention. The method begins at 310 with applying one or more contact bridges 240 (shown generally in FIG. 2 at 206). In one embodiment, contact bridges 240 comprise gold (Au) electroplating, or other similar electrical conducting material. In one embodiment, one or more contact bridges 240 are applied for each of accelerometers pairs 215 and gyroscope pairs 220. In one embodiment, applying contact bridges 240 comprises applying phosphorus-doped silicon dioxide (PSG) photoresist material deposited with a chemical-vapor deposition (CVD) and masking with lithography etching and sputter deposition. In one embodiment, the method proceeds at 320 with etching one or more mounting trenches 250 (shown generally in FIG. 2 at 206). In one embodiment, etching one or more mounting trenches 250 comprises masking with lithography and deep reactive ion etching (DRIE). In one embodiment, the photoresist is removed using a hydrofluoric-acid (HF) etch followed by one or more de-ionized water soaks. In one embodiment, the method continues at 330 with cutting and separating wafer 210 into cross sections 260 (shown generally in FIG. 2 at 207 and 208) parallel to contact bridges 240. In one embodiment, the method proceeds to 340 with cutting and separating cross sections 260 into individual wafer segments 270 (shown generally in FIG. 2 at 209).

Figure 4:
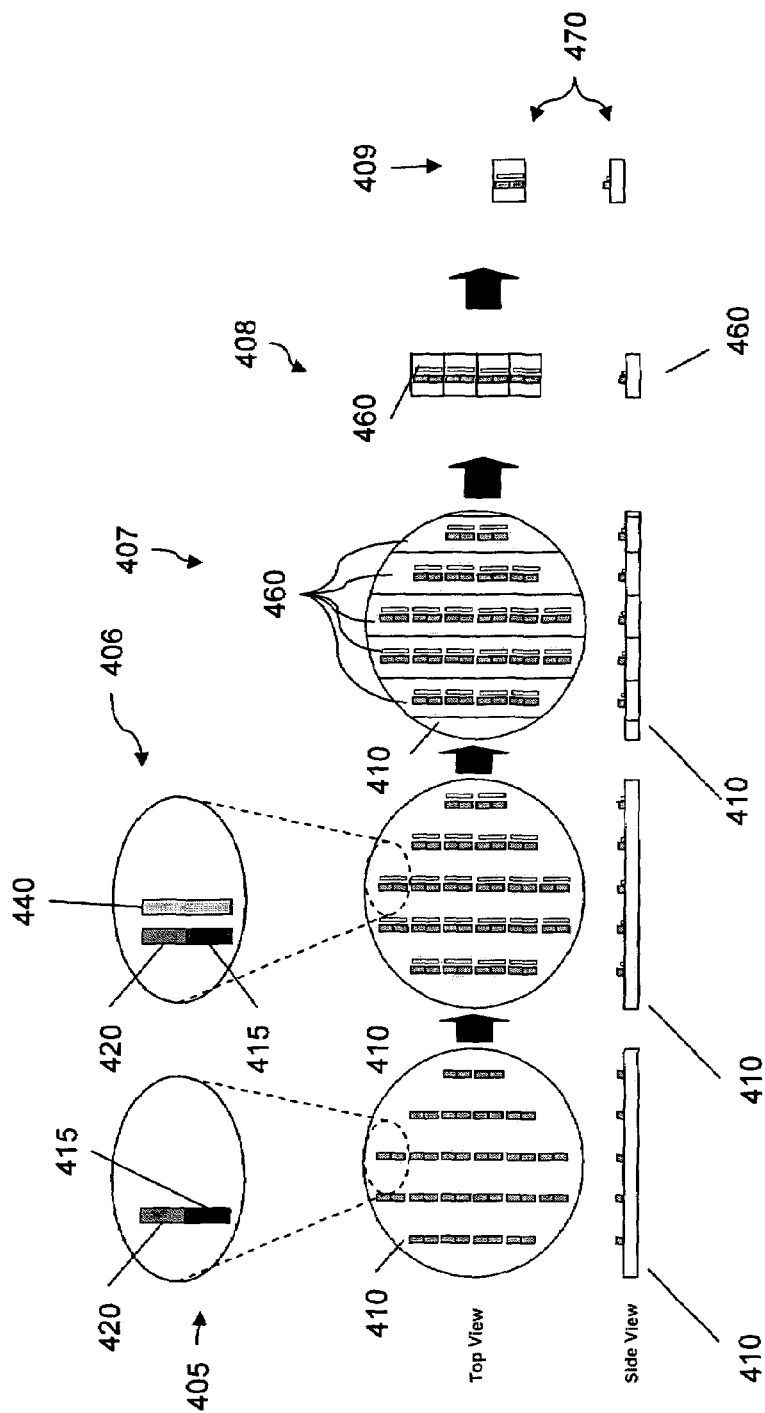
FIG. 4 is an illustration of one embodiment of production of a second silicon wafer segment of one embodiment of the present invention.
Figure 5:
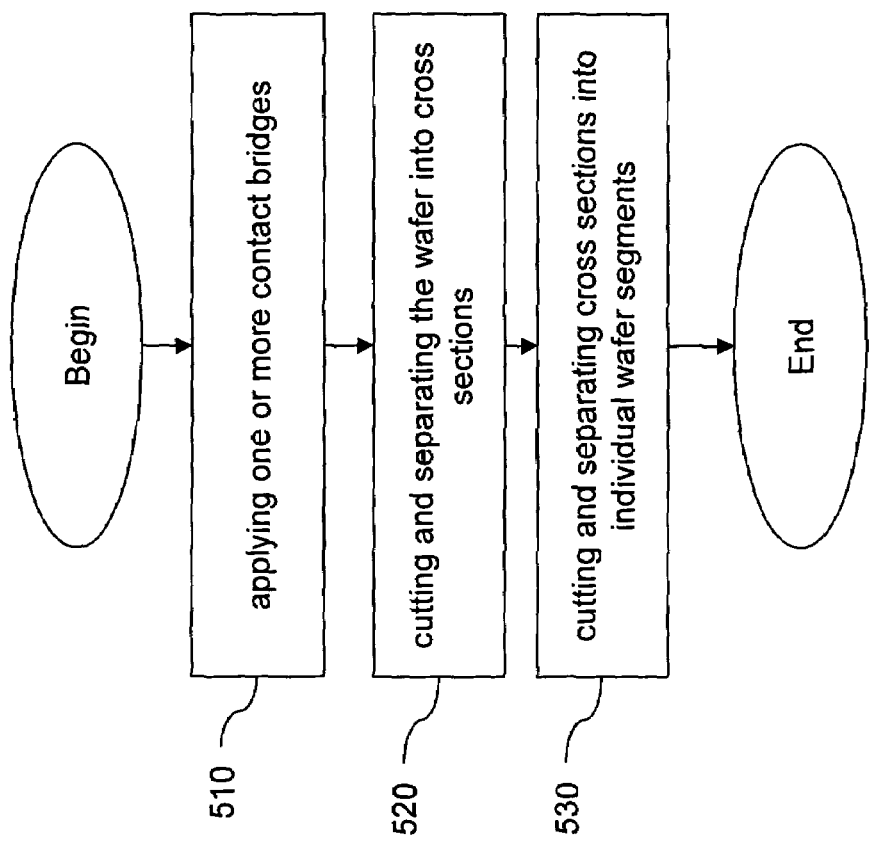
FIG. 5 is a flow chart of one embodiment of a method for producing a second silicon wafer segment.

FIGS. 4 and 5 illustrate one method for producing a second wafer segment 115 of one embodiment of the present invention from a larger silicon wafer 410. Shown generally at 405 in FIG. 4 in one embodiment, a silicon wafer 410 comprises a plurality of single axis accelerometers 415 and gyroscopes 420 as described with respect to wafer segment 115 of FIG. 1. FIG. 5 is a flow chart illustrating a method for fabricating a second silicon wafer segment 115 from silicon wafer 410, of one embodiment of the present invention. The method begins at 510 with applying one or more contact bridges 440 (shown generally in FIG. 4 at 406). In one embodiment, contact bridges 440 comprise Au electroplating, or other similar electrical conducting material. In one embodiment, one or more Au electroplating contact bridges is applied for each accelerometer 415 and gyroscope 420. In one embodiment, applying contact bridges 440 is comprised of applying PSG photoresist with a CVD and masking with lithography etching and sputter deposition. In one embodiment, the photoresist is removed using an HF etch followed by one or more de-ionized water soaks. In one embodiment, the method continues at 520 with cutting and separating wafer 410 into cross sections 460 (shown generally in FIG. 4 at 407 and 408) parallel to contact bridges 440. In one embodiment, the method proceeds to 530 with cutting and separating cross sections 460 into individual wafer segments 470 (shown generally in FIG. 4 at 409).

Figure 6:
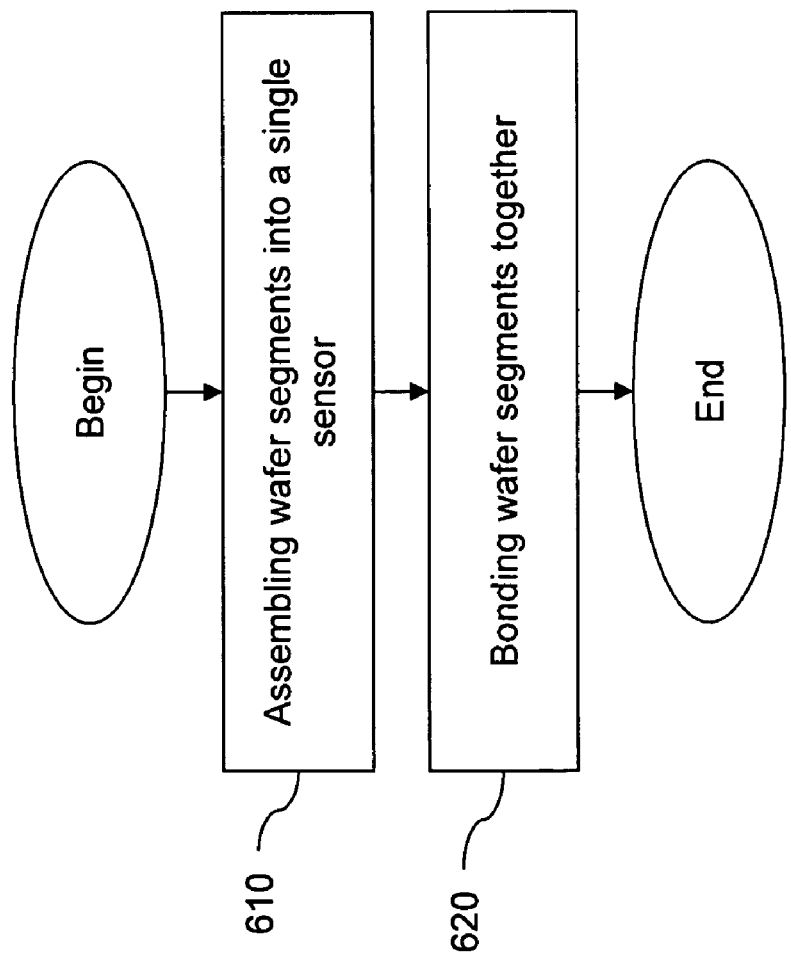
FIG. 6 is a flow chart of one embodiment of a method for producing a six degree of freedom inertial sensor from a first silicon wafer segment and a second silicon wafer segment.

A complete 6-DOF MEMS sensor, such as sensor 100, is produced from wafer segments 270 and 470 as illustrated by the method presented by FIG. 6. In one embodiment, the method begins at 610 with assembling wafer segment 470 and wafer segment 270 into a single sensor as portrayed in FIG. 1B. In one embodiment, assembling the wafer segments is comprised of inserting wafer segment 470 vertically into mounting trench 250 of wafer segment 270 such that contact bridge 240 contacts contact bridge 440 and accelerometer pairs 215 and gyroscope pairs 220 are orthogonal in axis with accelerometer 415 and gyroscope 420, respectively. The method then proceeds to 620 with bonding wafer segment 270 to wafer segment 470. In one embodiment, wafer segment 270 and wafer segment 470 are bonded together using a process such as, but not limited to, silicon fusion bonding.

Although this specification provides illustrative descriptions of a 6-DOF MEMS sensor having two accelerometers and two gyroscopes on one wafer segment, and one accelerometer and one gyroscope on the other, embodiments of the present invention are not so limited. To the contrary, embodiments of the present invention include wafer segments comprising any number of inertial sensors so long as the 6-DOF MEMS sensor comprises at least three orthogonally oriented sensors. For example, in an alternate embodiment a first wafer segment comprises four gyroscopes and two accelerometers and the second wafer segment comprises two gyroscopes and four accelerometers, so long as at least three of the accelerometers or at least three of the gyroscopes are orthogonally oriented with respect to each other.

As would be appreciated by one skilled in the art upon reading this specification, there exist a number of techniques available for fabricating inertial sensors such as accelerometers 120-1 to 120-3 and gyroscopes 125-1 to 125-3 in wafer segments 110 and 115 of FIG. 1A. For example, in one embodiment, accelerometers 120-1 to 120-3 are fabricated in wafer segments 110 and 115 using the Honeywell, Inc. capacitive pendulous accelerometer design and HIMEMS process. As another example, in one embodiment, gyroscopes 125-1 to 125-3 are fabricated onto wafer segments 110 and 115 using the vibratory-rate gyroscope designed by Morgan Research Corp. in conjunction with the U.S. Army Aviation and Missile Command and The Aegis Technologies Group. As would be appreciated by one skilled in the art upon reading this specification, these accelerometer and gyroscope designs are compatible with each other such that they can be manufactured in the same process in order to fabricate them on the same silicon wafer.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A six degree of freedom inertial sensor, the sensor comprising:
    a first silicon wafer segment comprising at least one inertial sensor pair fabricated from the first silicon wafer segment;
    a second silicon wafer segment comprising at least one inertial sensor fabricated from the second silicon wafer segment;
    wherein the at least one inertial sensor pair comprises at least one of an accelerometer pair and a gyroscope pair;
    wherein the at least one inertial sensor comprises at least one of an accelerometer and a gyroscope; and
    wherein the first silicon wafer segment and the second silicon wafer segment are bonded together such the at least one inertial sensor pair and the at least one inertial sensor are orientated orthogonal to each other.

2. The sensor of claim 1, wherein one or both of the first silicon wafer segment and the second silicon wafer segment further comprise one or more additional inertial sensors, wherein the one or more additional inertial sensors comprises one or more of an accelerometer and a gyroscope.

3. The sensor of claim 1, further comprising
    at least one contact bridge adapted to electrically couple the first silicon wafer segment to the second silicon wafer segment.

4. The sensor of claim 1, wherein the accelerometer pair comprises a pair of capacitive pendulous accelerometers; and
    wherein the at least one of an accelerometer and a gyroscope comprises a capacitive pendulous accelerometers.

5. The sensor of claim 1, wherein the gyroscope pair comprises a pair of vibratory-rate gyroscopes; and
    wherein the at least one of an accelerometer and a gyroscope comprises a vibratory-rate gyroscope.

6. The sensor of claim 1, wherein the first silicon wafer segment and the second silicon wafer segment are bonded together with a silicon fusion bonding.

7. A six degree of freedom inertial sensor, the sensor comprising:
    means for detecting one or both of acceleration and motion in a direction of a first axis;
    means for detecting one or both of acceleration and motion in a direction of a second axis orthogonal with the first axis;
    means for detecting one or both of acceleration and motion in a direction of a third axis orthogonal with the first axis and the second axis;
    wherein the means for detecting one or both of acceleration and motion in a direction of a first axis and the means for detecting one or both of acceleration and motion in a direction of a second axis are fabricated from a first silicon wafer and the means for detecting one or both of acceleration and motion in a direction of a third axis is fabricated from a second silicon wafer; and
    means for bonding the first silicon wafer to the second silicon wafer.

8. The sensor of claim 7, further comprising:
    means for electrically coupling the first silicon wafer with the second silicon wafer.

9. The sensor of claim 7, wherein one or more of the means for detecting acceleration in a direction of a first axis, the means for detecting acceleration in a direction of a second axis, and the means for detecting acceleration in a direction of a third axis comprise a capacitive pendulous accelerometers.

10. The sensor of claim 7, wherein one or more of the means for detecting motion in a direction of a first axis, the means for detecting motion in a direction of a second axis, and the means for detecting motion in a direction of a third axis comprise a vibratory-rate gyroscope.

* * * * *